(12) United States Patent
Vimercati et al.

(10) Patent No.: US 7,902,882 B2
(45) Date of Patent: Mar. 8, 2011

(54) APPARATUS INCLUDING A FOLLOWER OUTPUT BUFFER HAVING AN OUTPUT IMPEDANCE THAT ADAPTS TO A TRANSMISSION LINE IMPEDANCE

(76) Inventors: Daniele Vimercati, Besana in Brianza (IT); Riccardo Muzzetto, Caponago (IT)

(*) Notice: Subject to any disclaimer, the term of this patent is extended or adjusted under 35 U.S.C. 154(b) by 0 days.

(21) Appl. No.: 12/345,436

(22) Filed: Dec. 29, 2008

(65) Prior Publication Data

US 2010/0164558 A1   Jul. 1, 2010

(51) Int. Cl.
*H03K 3/00*   (2006.01)
(52) U.S. Cl. ............ 327/108; 327/112; 326/30
(58) Field of Classification Search .......... 327/108, 327/112; 326/30
See application file for complete search history.

(56) References Cited

U.S. PATENT DOCUMENTS

| | | | | |
|---|---|---|---|---|
| 4,394,625 A * | 7/1983 | Sakai | ............... | 330/267 |
| 5,006,739 A * | 4/1991 | Kimura et al. | ............... | 327/112 |
| 5,051,890 A * | 9/1991 | Nagasaki et al. | ............... | 711/213 |
| 5,177,451 A * | 1/1993 | Lehmann | ............... | 330/267 |
| 5,204,636 A * | 4/1993 | Werner et al. | ............... | 330/85 |
| 5,218,321 A * | 6/1993 | Jost | ............... | 330/263 |
| 5,323,122 A * | 6/1994 | Bowers | ............... | 330/263 |
| 5,332,934 A * | 7/1994 | Hashimoto et al. | ............... | 326/63 |
| 5,973,960 A * | 10/1999 | Shibata et al. | ............... | 365/185.08 |
| 6,166,971 A * | 12/2000 | Tamura et al. | ............... | 365/198 |
| 6,278,326 B1 * | 8/2001 | Murray et al. | ............... | 330/288 |
| 6,617,896 B2 * | 9/2003 | Uenishi et al. | ............... | 327/170 |
| 6,727,758 B2 * | 4/2004 | Govil | ............... | 330/264 |
| 6,876,235 B2 * | 4/2005 | Li et al. | ............... | 327/112 |
| 7,068,098 B1 * | 6/2006 | Bell et al. | ............... | 330/75 |
| 7,112,989 B2 * | 9/2006 | Ooshita et al. | ............... | 326/27 |
| 7,239,169 B2 * | 7/2007 | Isa et al. | ............... | 326/30 |
| 2004/0036139 A1 * | 2/2004 | Suzuki et al. | ............... | 257/500 |

* cited by examiner

*Primary Examiner* — Kenneth B. Wells
(74) *Attorney, Agent, or Firm* — Schwabe, Williamson & Wyatt

(57) ABSTRACT

Embodiments include but are not limited to apparatuses and systems including an output buffer including an input terminal for receiving an input signal, an output terminal for outputting an output signal, and a follower circuit coupling the input terminal and the output terminal, the follower circuit including at least one set of an NMOS transistor and a PMOS transistor, a drain terminal of the NMOS transistor coupled to a local supply voltage, and a drain terminal of the PMOS transistor coupled to a local ground voltage. Other embodiments may be described and claimed.

19 Claims, 3 Drawing Sheets

APPARATUS INCLUDING A FOLLOWER OUTPUT BUFFER HAVING AN OUTPUT IMPEDANCE THAT ADAPTS TO A TRANSMISSION LINE IMPEDANCE

TECHNICAL FIELD

Embodiments of the present disclosure relate generally to output buffers, and more particularly, to output buffers having an output impedance that adapts to the transmission line impedance.

BACKGROUND

With the increase in system performance, the challenges associated with the impact of higher frequencies on signal integrity have similarly increased. Transmission line effects can significantly affect transmitted data, particularly as transmission speeds increase. Other potentially problematic effects may include ringing, crosstalk, inter-symbol interference, simultaneous switching noise, power integrity, low immunity to power bouncing, and overshooting. Any one of these problems could seriously impact signal integrity, particularly for high-speed and high-throughput applications (e.g., DDR memory).

Impedance mismatch may be a culprit for a number of the foregoing problems. Impedance mismatch may be caused when the output impedance of the source, the impedance of the transmission line, and the impedance of the receiver are not equal.

Currently, the output impedance may be controlled in various ways including adding an output buffer, such as the complementary CMOS output buffer. Although it is possible to size the CMOS output buffer to have the desired output impedance, the output impedance generally depends on the applied gate-source voltage, Vgs. During commutation (signal switching), however, the CMOS transistor may have a variable impedance, resulting in the output impedance not matching the transmission line impedance. In fact, when Vgs=0V the output impedance is infinite, when Vgs=Vccq the output impedance is equal to the impedance Zo of the transmission line, and when Vgs is somewhere between 0V and Vccq (e.g., during the switching on phase) the output impedance is also somewhere between 0V and Vccq infinite and Zo but different than Zo (i.e., the impedance does not adapt).

The output buffer should also limit the current peak slope (di/dt) to limit the internal Vccq/Vssq noise produced by series inductance. To do this, the output edge slope is sometimes slowed down. Doing this, however, it takes longer to transit between infinite impedance and Zo value, resulting sometimes in inter-symbol interference effects.

Moreover, the typical CMOS output buffer generally transmits the supply noise directly onto the transmission line without attenuation. In fact, the resistance of the CMOS transistor may be equal to the transmission line impedance, and there may be a direct connection between the noisy supply and the output.

SUMMARY OF THE INVENTION

In accordance with embodiments of this disclosure, an output buffer having an output impedance that adapts to the transmission line impedance may be provided.

According to various embodiments, an output buffer may comprise an input terminal for receiving an input signal, an output terminal for outputting an output signal, and a follower circuit coupling the input terminal and the output terminal, the follower circuit including at least one set of an NMOS transistor and a PMOS transistor, a drain terminal of the NMOS transistor coupled to a local supply voltage, and a drain terminal of the PMOS transistor coupled to a local ground voltage.

Other features that are considered as characteristic for embodiments of the invention are set forth in the appended claims.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present disclosure, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present disclosure, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present disclosure may be shown and described as including a particular number of components or elements, embodiments of the disclosure are not limited to any particular number of components or elements.

Figure 1:
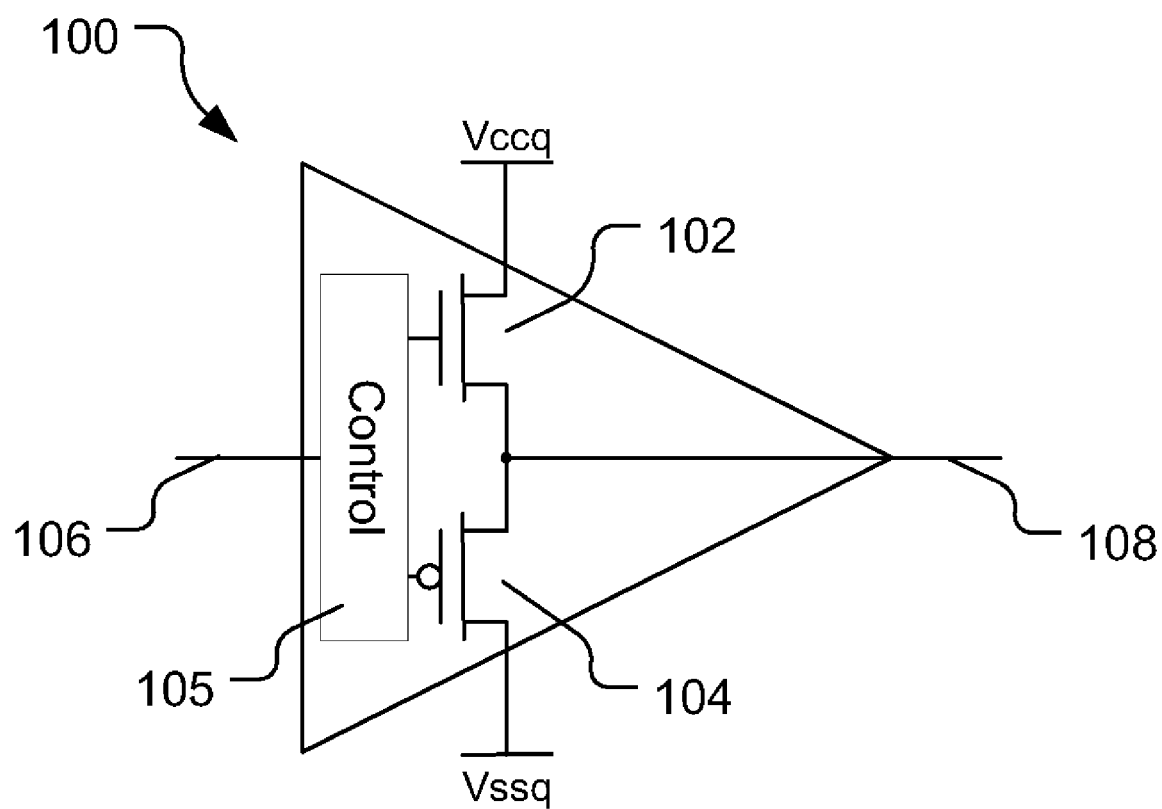
FIG. 1 illustrates a follower output buffer in accordance with various embodiments.

Turning now to FIG. 1, illustrated is a follower circuit 100 in accordance with various embodiments of the disclosure. The follower circuit 100 may include a first and a second state element, such as an NMOS type/like transistor 102 and a PMOS type/like transistor 104, hereinafter simply an NMOS transistor 102 and a PMOS transistor 104, arranged in series between a local supply voltage, Vccq, and a local ground voltage, Vssq. A drain terminal of the NMOS transistor 102 coupled to the local supply voltage, Vccq, and the drain terminal of the PMOS transistor 104 may be coupled to the local ground voltage, Vssq. The input terminal 106 for inputting an input signal may be coupled to control circuitry 105, which may be coupled to the gate terminal of the NMOS transistor 102 and to the gate terminal of the PMOS transistor 104. The source terminal of the NMOS transistor 102 and the source terminal of the PMOS transistor 104 may be connected to the output terminal 108.

In various embodiments, the follower circuit 100 may have an output impedance that substantially adaptively matches the impedance of a transmission line. Accordingly, the output impedance of the follower circuit 100 may not be affected by any variations in the input voltage. Furthermore, the follower circuit 100 may avoid the types of transmission line effects sometimes seen in various related art devices. This reduction may allow for improved quality in transmitted data signal integrity. In various embodiments, for example, the follower circuit 100 may reduce supply noise, thus increasing signal-to-noise ratio, and reduce inter-symbol interference associated with slowed output edges.

Figure 2:
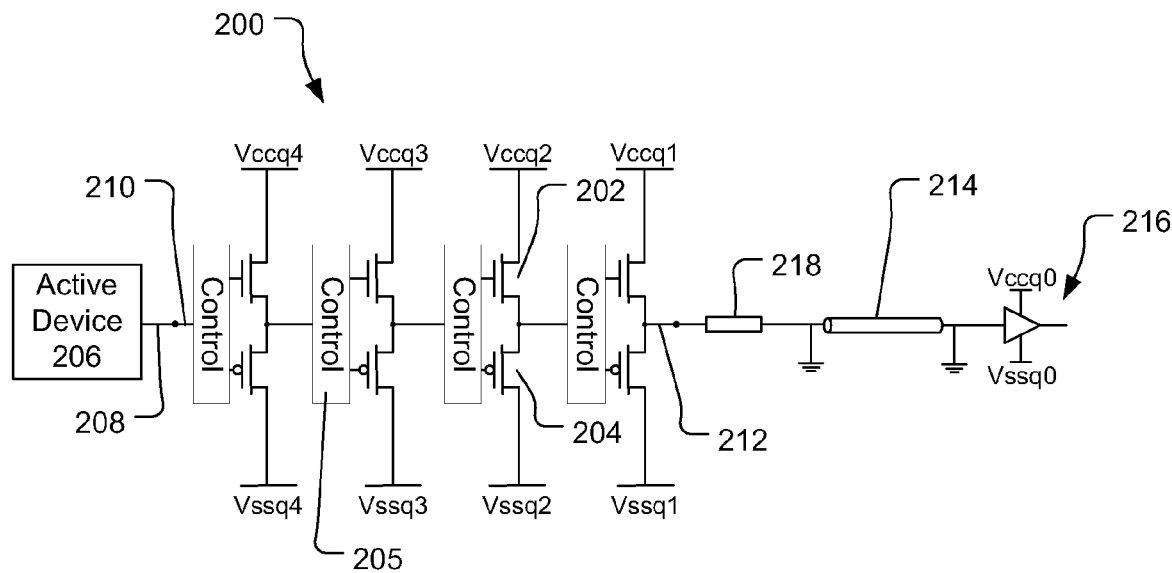
FIG. 2 illustrates an apparatus including a follower output buffer in accordance with various embodiments.

Follower circuits in accordance with various embodiments of the present disclosure may be used an output buffer stage for various devices. As illustrated in FIG. 2, an apparatus includes a follower circuit 200 having four NMOS type/like transistor 202/PMOS type/like transistor 204 sets, hereinafter simply, NMOS transistor 202/PMOS transistor 204 sets. An output buffer stage may, however, include any suitable number of NMOS transistor 202/PMOS transistor 204. Each set of NMOS transistors 202 and PMOS transistors 204 may be arranged in series between one of the local supply voltages, Vccq1-Vccq4, and local ground voltages, Vssq1-Vssq4. The voltages Vccq1-Vccq4 may be have the same voltage values or may be different voltages. Similarly, the voltages Vssq1-Vssq4 may be the same voltages or may be different. Drain terminals of the NMOS transistors 202 may be coupled to the local supply voltage, Vccq, and the drain terminals of the PMOS transistors 204 may be coupled to the local ground voltage, Vssq.

As illustrated, an output terminal 208 of an active device 206 may be coupled to an input terminal 210 of the follower circuit 200. The input terminal 208 for driving an input signal from the active device 206 may be coupled to control circuitry 205, which may be coupled to the gate terminals of the NMOS transistors 202 and to the gate terminals of the PMOS transistors 204. The source terminals of the NMOS transistors 202 and the source terminals of the PMOS transistors 204 may be connected to the output terminal 212.

The output terminal 212 of the follower circuit 300 may be coupled to a transmission line 214 for transmission to a receiver device (not illustrated) by way of an input buffer 216.

One or more resistive devices 218 may be coupled between the output terminal 212 and the transmission line 214. The resistive value of the resistive device(s) 218 may be any suitable resistive value for a particular application.

The active device 206 may be any type of active device. In various embodiments, the active device 206 may be any type of device for which integrity of the output data signal is desired. Output buffer stages including the follower circuit 200 may be particularly advantageous for memory devices in which integrity of the data signal may be important. High frequency and high throughput memory applications (e.g., double data rate applications), for example, may require minimal noise to ensure data quality.

Figure 3:
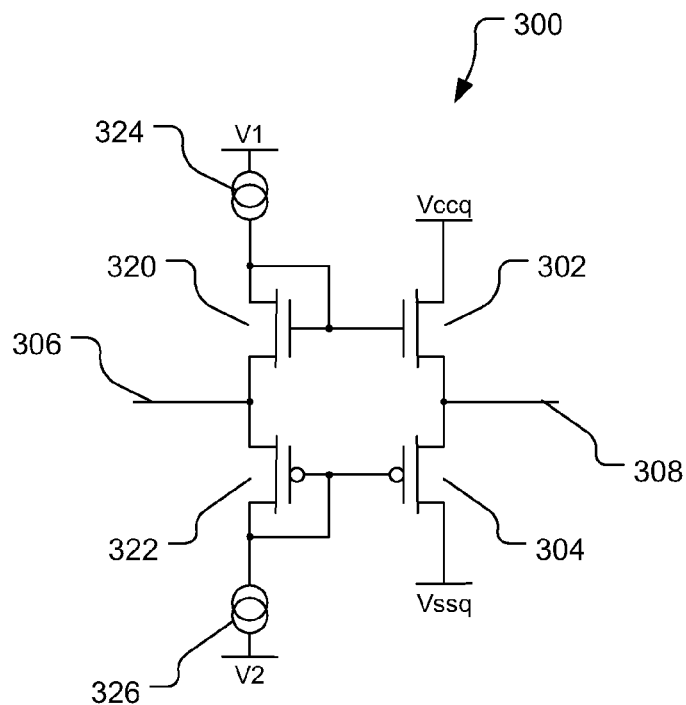
FIG. 3 illustrates an apparatus including a follower output buffer in accordance with various embodiments.

Turning now to FIG. 3, illustrated is another embodiment of an apparatus including a follower circuit 300. As in various other embodiments, the follower circuit 300 may include an NMOS type/like transistor 302 and a PMOS type/like transistor 304, hereinafter an NMOS transistor 302 and a PMOS transistor 304, arranged in series between a local supply voltage, Vccq, and a local ground voltage, Vssq. The drain terminal of the NMOS transistor 302 coupled to the local supply voltage, Vccq, and the drain terminal of the PMOS transistor 304 may be coupled to the local ground voltage, Vssq.

The follower circuit 300 may further include another set of an NMOS transistor 320 and a PMOS transistor 322, each of the NMOS transistor 320 and the PMOS transistor 322 being arranged in a current mirror configuration, with the gate terminals of the NMOS transistors 302, 320 being coupled, and the gate terminals of the PMOS transistors 304, 322 being coupled. Current generators 324, 326, coupled to supply voltages V1, V2, respectively, may be coupled to the drain and gate terminals of the NMOS transistor 320 and the PMOS transistor 322. Current generators 324, 326, NMOS transistor 320, and PMOS transistor 322 in the configuration illustrated in FIG. 3 may allow correct follower circuit 300 polarizations, improving matching by the follower circuit 300 for each input voltage (and also during switching) and reducing the output edge and electromagnetic interferences.

An input terminal 306 for inputting an input signal may be coupled to the source terminals of the NMOS transistor 320 and the PMOS transistor 322. The source terminals of the NMOS transistor 302 and the PMOS transistor 304 may be connected to an output terminal 308.

Figure 4:
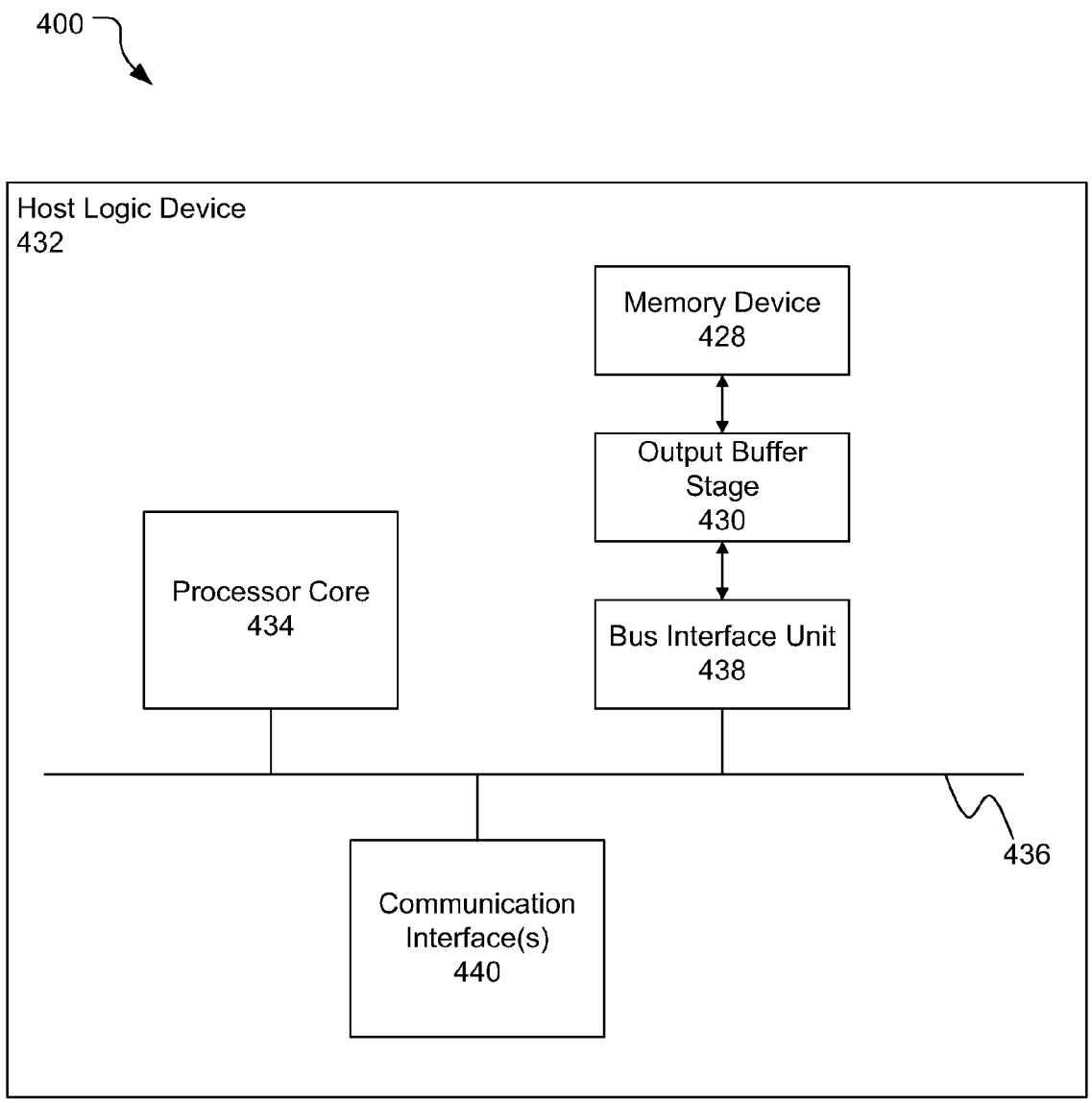
FIG. 4 is a block diagram of a system incorporating a follower output buffer in accordance with various embodiments.

Embodiments of follower circuits described herein may be incorporated into various apparatuses and systems. A block diagram of an exemplary system 400 is illustrated in FIG. 4. As illustrated, the system 400 may include a memory device 428 and an output buffer stage 430 operatively coupled to the memory device 428.

In various embodiments, the output buffer stage 430 may include a follower circuit (not illustrated) including at least one set of an NMOS transistor and a PMOS transistor. As described elsewhere herein, a drain terminal of the NMOS transistor may be coupled to a local supply voltage, while the drain terminal of the PMOS transistor may be coupled to a local ground voltage. An input terminal of the output buffer stage 430 may be coupled to an output terminal of the memory device 428. The output buffer stage 430 may include an output terminal connected to a transmission line, and the follower circuit of the output buffer stage 430 may have an output impedance substantially adaptively adaptively matching an impedance of the transmission line, and slowing output edge (with respect to T data) to minimize power supply noise, intersymbol interference, and electromagnetic interferences.

The memory device 428 may be any type of memory. For example, in various embodiments, the memory device 428 may include a memory cell array including memory cells that are each formed by a floating gate metal oxide semiconductor (MOS) transistor. In other embodiments, other transistor or transistor-like technologies may be used. The memory device 428 may include any suitable non-volatile memory such as, but not limited to, NOR flash memory cells, NAND flash memory cells, phase change memory cells, etc.

In various embodiments, the memory device 428 and the output buffer stage 430 may be embedded in a host logic device 432, and may form an embedded memory module. The host logic device 432 may be any device type for which memory may be embedded. For example, in various embodiments, the host logic device 432 may be a microcontroller or a digital signal processor. Other device types may be similarly suitable. The host logic device 432 may include a processor core 434.

The system 400 may comprise a host logic device bus 436, and a bus interface unit 438 operatively coupling the output buffer stage 430 and the host logic device bus 436. In various embodiments, the system 400 may employ other system architectures. In various embodiments, the system 400 may be a desktop or laptop computer, a server, a set-top box, a digital recorder, a game console, a personal digital assistant, a mobile phone, a digital media player, or a digital camera.

The system 400 may include communications interface(s) 440 to provide an interface for system 400 to communicate over one or more networks and/or with any other suitable device. Communications interface(s) 440 may include any suitable hardware and/or firmware. Communications interface(s) 440 for one embodiment may include, for example, a network adapter, a wireless network adapter, a telephone modem, and/or a wireless modem. For wireless communications, communications interface(s) 440 for one embodiment may use one or more antennas (not illustrated).

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
an active device having an output terminal;
a first follower circuit having an input terminal coupled to the output terminal of the active device for receiving an input signal from the active device,
the first follower circuit including:
a first NMOS transistor and a first PMOS transistor, a drain terminal of the first NMOS transistor coupled to a local supply voltage, and a drain terminal of the first PMOS transistor coupled to a local ground voltage; and
a second NMOS transistor and a second PMOS transistor, wherein the first and second NMOS transistors and the first and second PMOS transistors are arranged in a current mirror configuration, a gate terminal of the second NMOS transistor is coupled to a gate terminal of the first NMOS transistor, and a gate terminal of the second PMOS transistor is coupled to a gate terminal of the first PMOS transistor; and
a second follower circuit having an input terminal coupled to the output terminal of the first follower circuit, the second follower circuit including:
a third NMOS transistor and a third PMOS transistor, a drain terminal of the third NMOS transistor coupled to the local supply voltage, and a drain terminal of the third PMOS transistor coupled to the local ground voltage; and
a fourth NMOS transistor and a fourth PMOS transistor, wherein the third and fourth NMOS transistors and the third and fourth PMOS transistors are arranged in a current mirror configuration, a gate terminal of the fourth NMOS transistor is coupled to a gate terminal of the third NMOS transistor, and a gate terminal of the fourth PMOS transistor is coupled to a gate terminal of the third PMOS transistor.

2. The apparatus of claim 1, wherein a source terminal of the first NMOS transistor and a source terminal of the first PMOS transistor are directly coupled to the input terminal of the second follower circuit.

3. The apparatus of claim 2, wherein the input terminal of the first follower circuit is directly coupled to the source terminal of the second NMOS transistor and to the source terminal of the second PMOS transistor, and wherein the input terminal of the second follower circuit is directly coupled to the source terminal of the fourth NMOS transistor and to the source terminal of the fourth PMOS transistor.

4. The apparatus of claim 1, wherein the apparatus is an output buffer stage.

5. The apparatus of claim 1, further comprising a resistive device coupled to the output terminal of the second follower circuit.

6. The apparatus of claim 1, wherein the output terminal is coupled to a transmission line, and wherein the follower circuit has an output impedance substantially adaptively matching an impedance of the transmission line.

7. The apparatus of claim 1, further comprising a first control circuit, wherein the first control circuit includes an input terminal directly coupled to the output terminal of the active device, and further includes an output terminal directly coupled to the input terminal of the first follower circuit.

8. The apparatus of claim 7, further comprising a second control circuit, wherein the second control circuit includes an input terminal directly coupled to the output terminal of the first follower circuit, and further includes an output terminal directly coupled to the input terminal of the second follower circuit.

9. A system comprising:
an output buffer stage including:
a first follower circuit including a first NMOS transistor and a first PMOS transistor, a drain terminal of the first NMOS transistor coupled to a local supply voltage, and a drain terminal of the first PMOS transistor coupled to a local ground voltage, and further including a second NMOS transistor and a second PMOS, wherein the first and second NMOS transistors and the first and second PMOS transistors are arranged in a current mirror configuration, a gate terminal of the second NMOS transistor is coupled to a gate terminal of the first NMOS transistor, and a gate terminal of the second PMOS transistor is coupled to a gate terminal of the first PMOS transistor;
a second follower circuit having an input terminal coupled to the output terminal of the first follower circuit, the second follower circuit including a third NMOS transistor and a third PMOS transistor, a drain terminal of the third NMOS transistor coupled to the local supply voltage, and a drain terminal of the third PMOS transistor coupled to the local ground voltage, and further including a fourth NMOS transistor and a fourth PMOS transistor, wherein the third and fourth NMOS transistors and the third and fourth PMOS transistors are arranged in a current mirror configuration, a gate terminal of the fourth NMOS transistor is coupled to a gate terminal of the third NMOS transistor, and a gate terminal of the fourth PMOS transistor is coupled to a gate terminal of the third PMOS transistor;

a memory device including an output terminal coupled to an input terminal of the output buffer stage;

a host logic device bus; and a bus interface unit coupling the output buffer stage and the host logic device bus.

10. The system of claim 9, wherein the memory device comprises memory cells selected from the group consisting of NOR flash memory cells, NAND flash memory cells, and phase change memory cells.

11. The system of claim 9, wherein the output buffer stage includes an output terminal coupled to a transmission line, and wherein the first and second follower circuits have an output impedance substantially adaptively matching an impedance of the transmission line.

12. The system of claim 9, wherein a source terminal of the first NMOS transistor and a source terminal of the first PMOS transistor are directly coupled to the input terminal of the second follower circuit.

13. The system of claim 12, wherein the output terminal of the memory device is directly coupled to the source terminal of the second NMOS transistor and to the source terminal of the second PMOS transistor.

14. The system of claim 9, wherein the output buffer stage, the memory device, and the bus interface unit form an embedded memory module.

15. The system of claim 14, wherein the host logic device is a microcontroller or a digital signal processor, and the system is a selected one of a desktop or laptop computer, a server, a set-top box, a digital recorder, a game console, a personal digital assistant, a mobile phone, a digital media player, or a digital camera.

16. A method comprising:

providing a first follower circuit including a first NMOS transistor and a first PMOS transistor, a drain terminal of the first NMOS transistor coupled to a local supply voltage, and a drain terminal of the first PMOS transistor coupled to a local ground voltage, and further including a second NMOS transistor and a second PMOS, wherein the first and second NMOS transistors and the first and second PMOS transistors are arranged in a current mirror configuration, a gate terminal of the second NMOS transistor is coupled to a gate terminal of the first NMOS transistor, and a gate terminal of the second PMOS transistor is coupled to a gate terminal of the first PMOS transistor;

providing a second follower circuit having an input terminal coupled to the output terminal of the first follower circuit, the second follower circuit including a third NMOS transistor and a third PMOS transistor, a drain terminal of the third NMOS transistor coupled to the local supply voltage, and a drain terminal of the third PMOS transistor coupled to the local ground voltage, and further including a fourth NMOS transistor and a fourth PMOS transistor, wherein the third and fourth NMOS transistors and the third and fourth PMOS transistors are arranged in a current mirror configuration, a gate terminal of the fourth NMOS transistor is coupled to a gate terminal of the third NMOS transistor, and a gate terminal of the fourth PMOS transistor is coupled to a gate terminal of the third PMOS transistor;

receiving an input signal on an input terminal of the first follower circuit;

modifying, using the first follower circuit, an impedance of the input signal;

modifying, using the second follower circuit, an impedance of the modified input signal received from the first follower circuit; and outputting an output signal from an output terminal of the second follower circuit onto a transmission line.

17. The method of claim 16, further comprising providing a supply voltage on a drain terminal of the first NMOS transistor, and providing a local ground voltage to a drain terminal of the first PMOS transistor.

18. The method of claim 16, further comprising driving the input signal by an active device including an output terminal directly coupled to the input terminal of the first follower circuit.

19. The method of claim 18, wherein the driving comprises driving the input signal by a memory device.

* * * * *